(12) United States Patent
Park et al.

(10) Patent No.: US 7,932,671 B2
(45) Date of Patent: Apr. 26, 2011

(54) ORGANIC ELECTROLUMINESCENT DISPLAY DEVICE AND METHOD OF FABRICATING THE SAME

(75) Inventors: Kyung-Min Park, Gumi (KR); Seok-Jong Lee, Gumi (KR); Jae-Hee Park, Daegu (KR); Sang-Ho Yu, Seongnam (KR)

(73) Assignee: LG Display Co., Ltd., Seoul (KR)

( * ) Notice: Subject to any disclaimer, the term of this patent is extended or adjusted under 35 U.S.C. 154(b) by 453 days.

(21) Appl. No.: 11/639,169

(22) Filed: Dec. 15, 2006

(65) Prior Publication Data

US 2008/0001529 A1    Jan. 3, 2008

(30) Foreign Application Priority Data

Jun. 29, 2006  (KR) .................... 10-2006-0059354

(51) Int. Cl.
*H01J 1/62* (2006.01)
(52) U.S. Cl. .......... 313/506; 313/504; 313/509; 445/24
(58) Field of Classification Search ........... 313/498–512
See application file for complete search history.

(56) References Cited

U.S. PATENT DOCUMENTS

| 6,046,543 | A | 4/2000 | Bulovic et al. |
| 6,501,448 | B1* | 12/2002 | Komiya et al. ................. 345/80 |
| 2003/0116772 | A1 | 6/2003 | Yamazaki et al. |
| 2003/0173564 | A1 | 9/2003 | Ko et al. |
| 2005/0093432 | A1* | 5/2005 | Yamazaki et al. ............ 313/503 |
| 2005/0242718 | A1* | 11/2005 | Chung et al. ............... 313/504 |
| 2005/0269967 | A1* | 12/2005 | Park et al. ..................... 315/222 |

FOREIGN PATENT DOCUMENTS

| CN | 1623117 A | 6/2005 |
| JP | 2005-175248 | 6/2005 |
| TW | 2005-36434 | 11/2005 |

* cited by examiner

*Primary Examiner* — Bumsuk Won
(74) *Attorney, Agent, or Firm* — Morgan, Lewis & Bockius LLP

(57) ABSTRACT

An organic electroluminescent display (OELD) device includes first substrate; a plurality of gate lines and a plurality of data lines crossing each other to define a plurality of pixel regions; a power line parallel to and separated from the gate lines; switching and driving elements connected to each other in each of the plurality of pixel regions on the first substrate; a first electrode on the first substrate and connected to one of the driving element; an injection layer on the first electrode; an organic luminescent layer on the injection layer; a second electrode of a transparent conductive material on the organic luminescent layer; and a second substrate attached to and facing the first substrate.

22 Claims, 17 Drawing Sheets

ORGANIC ELECTROLUMINESCENT DISPLAY DEVICE AND METHOD OF FABRICATING THE SAME

The present application claims the benefit of Korean Patent Application No. 2006-0059354 filed in Korea on Jun. 29, 2006, which is hereby incorporated by reference.

BACKGROUND OF THE INVENTION

1. Field of the Invention

The present invention relates to an organic electroluminescent display device, and more particularly, to a top emission type organic electroluminescent display device having high luminance and a method of fabricating the same.

2. Discussion of the Related Art

In general, an organic electroluminescent display (OELD) device emits light by injecting electrons from a cathode and holes from an anode into an emission layer, combining the electrons with the holes, generating an exciton, and transforming the exciton from an excited state to a ground state. Unlike the liquid crystal display (LCD) device, the OELD device does not require an additional light source, and therefore, has the advantage of compact volume and light weight.

Since the OELD device has excellent characteristics, such as low power consumption, high luminance, high response time and light weight, the OELD device can be used in various electronic products, such as mobile phones, PDAs, camcorders and plam PCs. Moreover, because the OELD device is manufactured by a relatively simple fabricating process, the OELD has a low production cost as compared with the conventional LCD device.

OELD devices are categorized into a passive matrix type and an active matrix type, according to the driving method used. The passive matrix type OELD device has a simple structure and a more simple fabricating process. However, the passive matrix type OELD device requires high power consumption and is less conducive for use as a large size display. Moreover, as more electric lines are required in the device, the aperture ratio is reduced.

In contrast, the active matrix type OELD device has high emission efficiency and high quality images. FIG. 1 is a cross-sectional view showing the active matrix type OELD device according to the related art.

As shown in FIG. 1, the OELD device 10 includes first and second substrates 12 and 28 facing each other. The first substrate 12 is transparent and flexible. The first substrate 12 includes an array element 14 having a plurality of thin film transistors (TFTs) T and an organic electroluminescent diode E with a first electrode 16, an organic luminescent layer 18 and a second electrode 20. The organic luminescent layer 18 includes an organic material of one of a red, green and blue color deposited in each pixel region P.

The second substrate 28 includes a moisture absorbent powder 22. The moisture absorbent powder 22 is formed to remove moisture in the inner surface of the OELD device. The moisture absorbent powder 22 is disposed in a concave portion of the second substrate 28, and then, the moisture absorbent powder 22 is sealed by taping 25. A seal pattern 26 is disposed between the first and second substrates 12 and 28 such that the first and second substrates 12 and 28 are attached to each other.

In the above-mentioned structure, since the first electrode 16 is formed of a transparent metallic material, the light emitted from the organic luminescent layer 18 emits downward through the first electrode 16. Thus, this structure is often referred to as a bottom emission type.

FIG. 2 is a circuit diagram of an OELD device according to the related art.

As shown in FIG. 2, gate and data lines 42 and 44 are formed on the substrate 32. The gate and data lines 42 and 44 cross each other, and a switching element Ts is formed at each crossing of the gate and data lines 42 and 44. The switching element Ts includes a gate electrode 46, a source electrode 56 and a drain electrode 60. The gate electrode 46 is connected to the gate line 42. The source electrode 56 is connected to the data line 44 and separated from the drain electrode 60. A driving element $T_D$ is electrically connected to the switching element Ts. The driving element $T_D$ includes a gate electrode 68, a source electrode 66 and a drain electrode 63. The gate electrode 68 of the driving element $T_D$ is connected to the switching element Ts. The driving element $T_D$ is constituted by a p-type TFT, and a storage capacitor Cst is formed between the source and gate electrodes 66 and 68 of the driving element $T_D$. The drain electrode 63 of the driving element $T_D$ is connected to the first electrode 16 (of FIG. 1) of the organic electroluminescent diode E. Moreover, a power line 55 is connected to the source electrode 66 of the driving element $T_D$.

When a gate signal from the gate line 42 is supplied to the gate electrode 46 of the switching element Ts, a data signal from the data line 44 is supplied to the gate electrode 68 of the driving element $T_D$ through the switching element Ts. Then, the organic electroluminescent diode E is driven by the driving element $T_D$ such that the organic electroluminescent diode E emits light. In this case, a stored voltage in the storage capacitor Cst functions to maintain a voltage level in the gate electrode 68 of the driving element $T_D$. Accordingly, even if the switching element Ts is in the off state, a voltage level in the organic electroluminescent diode E is kept. The switching element Ts and the driving element $T_D$ include a semiconductor layer of one of amorphous silicon and polycrystalline silicon. When the semiconductor is formed of amorphous silicon, the switching element Ts and the driving element $T_D$ can be easily fabricated.

FIG. 3 is a plane view showing an array element of an active matrix type OELD device according to the related art. As shown in FIG. 3, the active matrix type OELD device includes the switching element Ts, the driving element $T_D$ and the storage capacitor Cst in the pixel region P and on the substrate 32. According to characteristics of the OELD device, the pixel region P includes more than one switching element Ts and one driving element $T_D$.

The gate line 42 and the data line 44 are formed on the substrate 32 with a gate insulating layer (not shown) interposed therebetween. The pixel region P is defined by crossings of the gate and data lines 42 and 44. The power line 55 is formed on the substrate 32. The power line 55 may be parallel to and separated from the gate line 42.

As mentioned above, the switching element Ts includes the gate electrode 46, the active layer 50 and the source and drain electrodes 56 and 60. The gate electrode 46 of the switching element Ts is connected to the gate line 42, and the source electrode 56 of the switching element Ts is connected to the data line 44. The drain electrode 60 of the switching element Ts is connected to the gate electrode 68 of the driving element $T_D$ through a gate contact hole 64.

The driving element $T_D$ includes the gate electrode 68, the active layer 62 and the source and drain electrodes 66 and 63. The source electrode 66 of the driving element $T_D$ is connected to the power line 55 through a power line contact hole 58. The drain electrode 63 of the driving element $T_D$ is connected to the first electrode 36 (FIG. 4). Moreover, the power line 55 and a silicon pattern 35 constitute the storage capacitor Cst with a gate insulating layer interposed therebetween. Further, the first electrode 36 of the organic electroluminescent diode E (of FIG. 1) is formed over the driving element $T_D$. The first electrode 36 is connected to the drain electrode 63 of the driving element $T_D$ through the drain contact hole 65.

FIG. 4 is a cross-sectional view taken along the line IV-IV of FIG. 3.

As shown in FIG. 4, the driving element $T_D$ and the organic electroluminescent diode E are formed on the substrate 32 of the OELD device. The driving element $T_D$ includes the gate electrode 68, an active layer 62 and the source and drain electrodes 66 and 63. The organic electroluminescent diode E includes the first electrode 36, the organic luminescent layer 38 and the second electrode 40. The first electrode 36 contacts the drain electrode 63 of the driving element $T_D$ through the drain contact hole 65, and the organic luminescent layer 38 is interposed between the first and second electrodes 36 and 40. The first and second electrodes 36 and 40 function as anode and cathode, respectively. The storage capacitor Cst includes a silicon pattern 35 as a first storage electrode, a power line 55 as a second storage electrode, and a dielectric layer interposed therebetween. The second storage electrode 55 is connected the source electrode 66 of the driving element $T_D$.

FIG. 5 is a schematic cross-sectional view of an organic electroluminescent diode according to the related art.

As shown in FIG. 5, the organic electroluminescent diode E including the first electrode 36, the organic luminescent layer 38 and the second electrode 40 is formed on the substrate 32. Though not shown, the substrate 32 includes the array element including the driving element $T_D$ (of FIG. 4). The first electrode 36 is connected to the driving element $T_D$ (of FIG. 4). The first and second electrode 36 and 40 function as an anode and a cathode, respectively. The organic luminescent layer 38 includes a hole injection layer (HIL) 38a, a hole transporting layer (HTL) 38b, an emitting material layer (EML) 38c, an electron transporting layer (ETL) 38d and an electron injection layer (EIL) 38e. Since an organic material may have a different mobility for the holes and than for the electrons, the HTL 38b and the ETL 38d will improve emitting efficiency. Moreover, the HIL 38a and EIL 38e will reduce an injection energy barrier of the hole and the electron.

Generally, the second electrode 40, as a cathode, is formed of a low work function material, such as calcium (Ca), aluminum (Al), magnesium (Mg), antigen (Ag) or lithium (Li). The first electrode 36, as an anode, is formed of a transparent metallic material, such as indium-tin-oxide (ITO) or indium-zinc-oxide (IZO). A transparent material is not used for the cathode (i.e., the second electrode 40). Since an ITO layer is deposited by a sputtering method, it is difficult to deposit the ITO layer on the organic luminescent layer 38 because of damage to the organic luminescent layer 38 by the sputtering process. Accordingly, the ITO layer, as an anode, is formed under the organic luminescent layer 38 such that the OELD device is a bottom emission type OELD device.

The bottom emission type OELD device according to the related art has a number of problems. First, the bottom emission type OELD has problems in luminance and aperture ratio. Second, since the anode is directly connected to the driving element, the driving element should include a p-type polycrystalline, which results in a complicated fabricating process for the OELD device. Moreover, when the anode is formed under the organic luminescent layer, the anode is exposed to air during the fabricating process such that an oxidation layer, which is formed from reaction between the anode and the air, causes a short circuit problem between the anode and the EIL.

SUMMARY OF THE INVENTION

Accordingly, the present invention is directed to an organic electroluminescent display (OELD) device and a method of fabricating the same that substantially obviate one or more of the problems due to limitations and disadvantages of the related art.

An object of the present invention is to provide an OELD device that prevents short circuits between an anode and an organic luminescent layer.

Another object of the present invention is to provide an OELD with an organic luminescent layer less prone to damage during fabrication of an electrode thereon.

Another object of the present invention is to provide an OELD with a less complicated manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display (OELD) device comprises first substrate; a plurality of gate lines and a plurality of data lines crossing each other to define a plurality of pixel regions; a power line parallel to and separated from the gate lines; switching and driving elements connected to each other in each of the plurality of pixel regions on the first substrate; a first electrode on the first substrate and connected to one of the driving element; an injection layer on the first electrode; an organic luminescent layer on the injection layer; a second electrode of a transparent conductive material on the organic luminescent layer; and a second substrate attached to and facing the first substrate.

In another aspect, a method of fabricating an OELD device, comprises forming switching and driving elements connected to each other on a first substrate including a pixel region; forming a first electrode on and connected to the driving element; forming an injection layer on the first electrode; forming an organic luminescent layer on the injection layer; forming a second electrode of a transparent conductive material on the organic luminescent layer; and attaching a second substrate to the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

In the present invention, an organic electroluminescent display (OELD) device includes a transparent conductive electrode and an opaque electrode as uppermost and lowest layers of an organic electroluminescent diode. An injection layer is formed between the opaque electrode and an organic luminescent layer to prevent a short circuit resulted from an oxidation layer between the opaque electrode and the organic luminescent layer. Moreover, a buffer layer is formed as an uppermost layer of the organic luminescent layer to prevent damage to the organic luminescent layer during deposition of the transparent conductive electrode.

Figure 1:
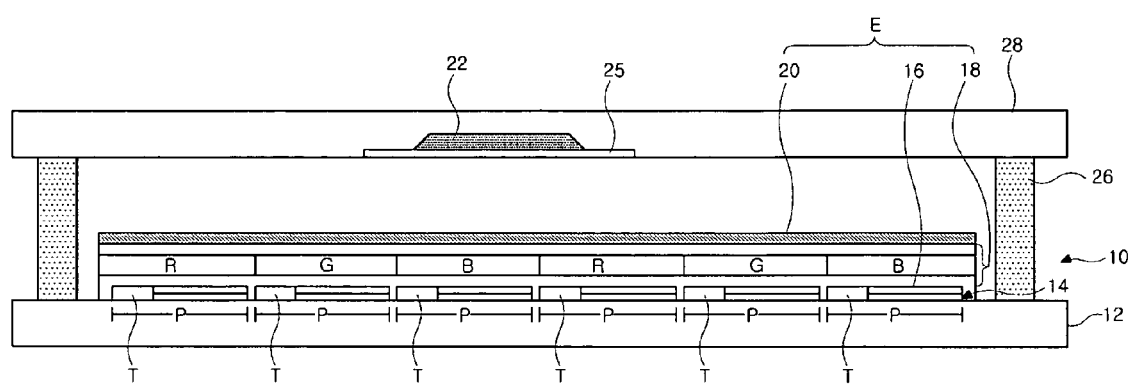
FIG. 1 is a cross-sectional view showing the active matrix type OELD device according to the related art.
Figure 2:
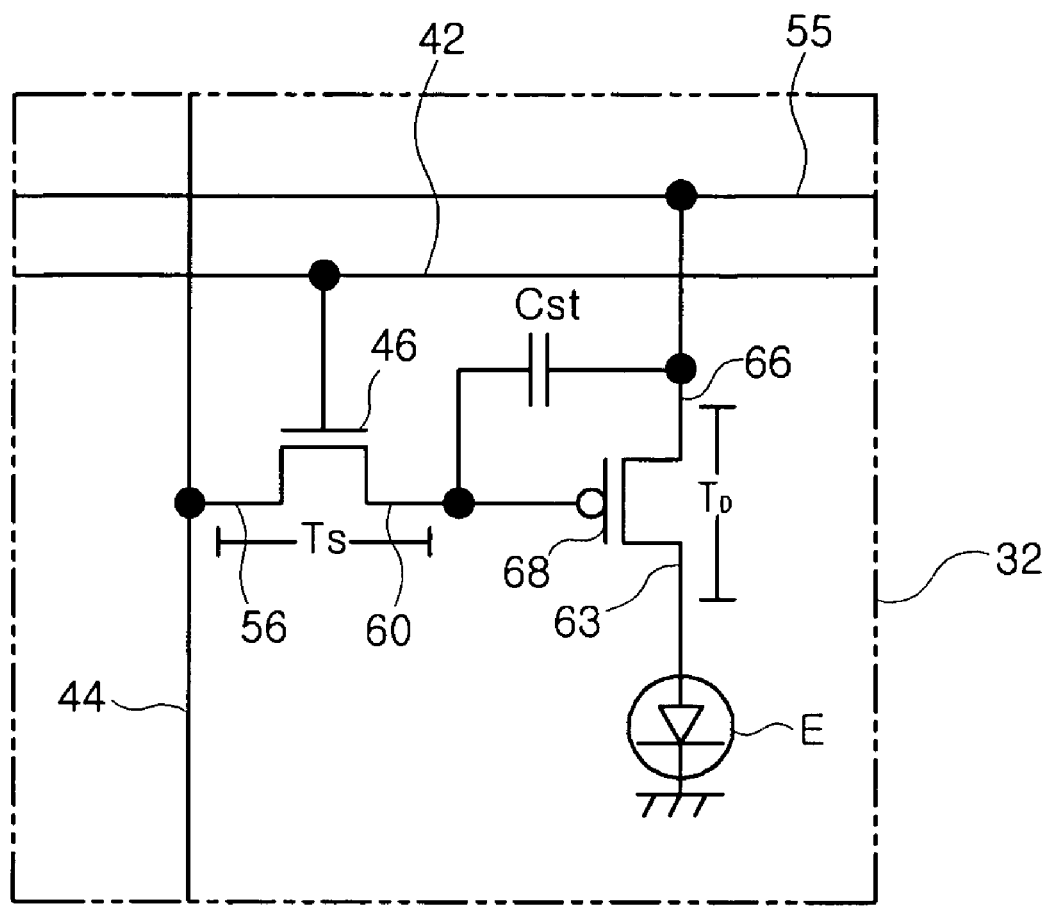
FIG. 2 is a circuit diagram of an OELD device according to the related art.
Figure 3:
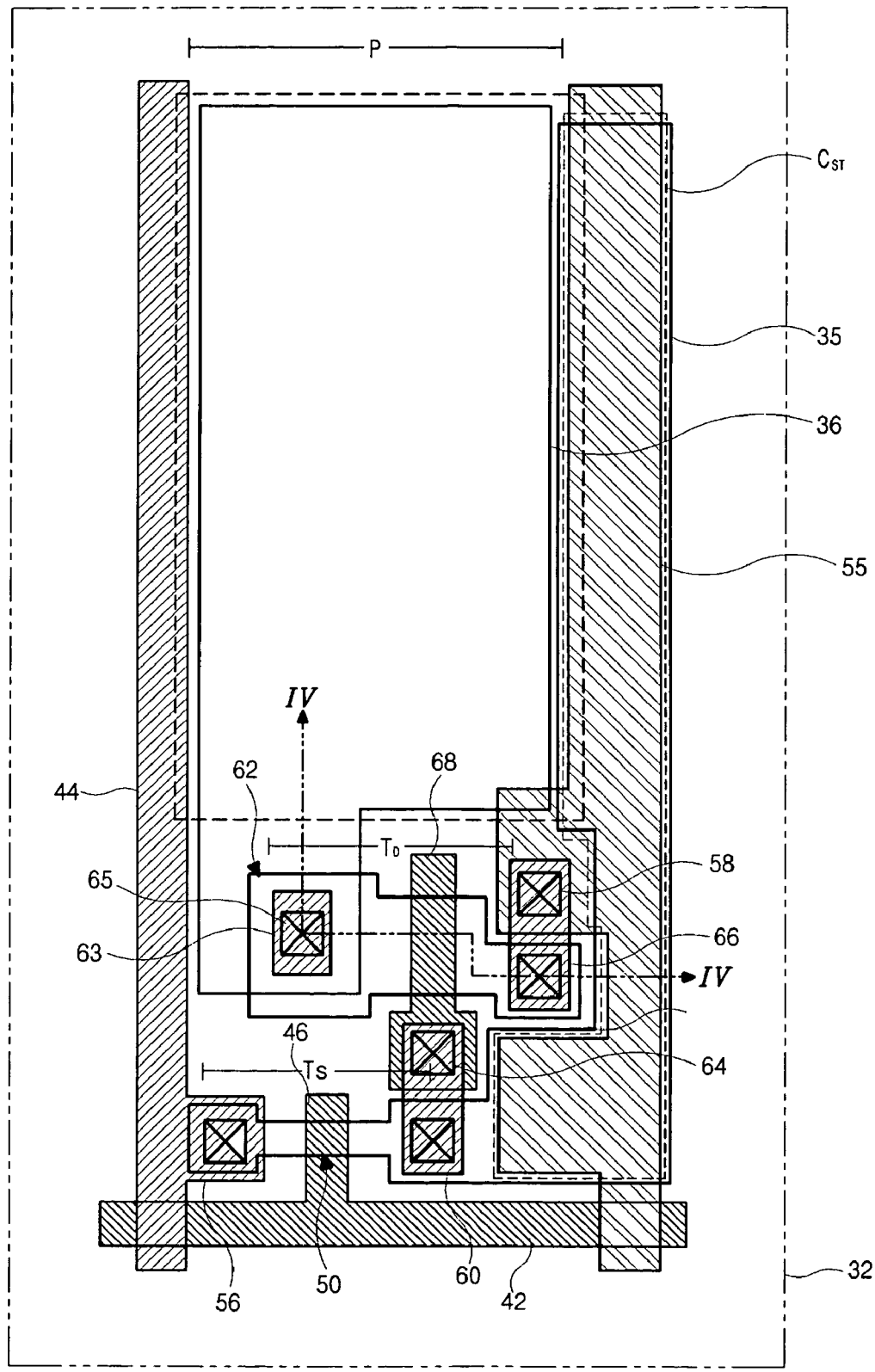
FIG. 3 is a schematic plane view showing an array element of an active matrix type OELD device according to the related art.
Figure 4:
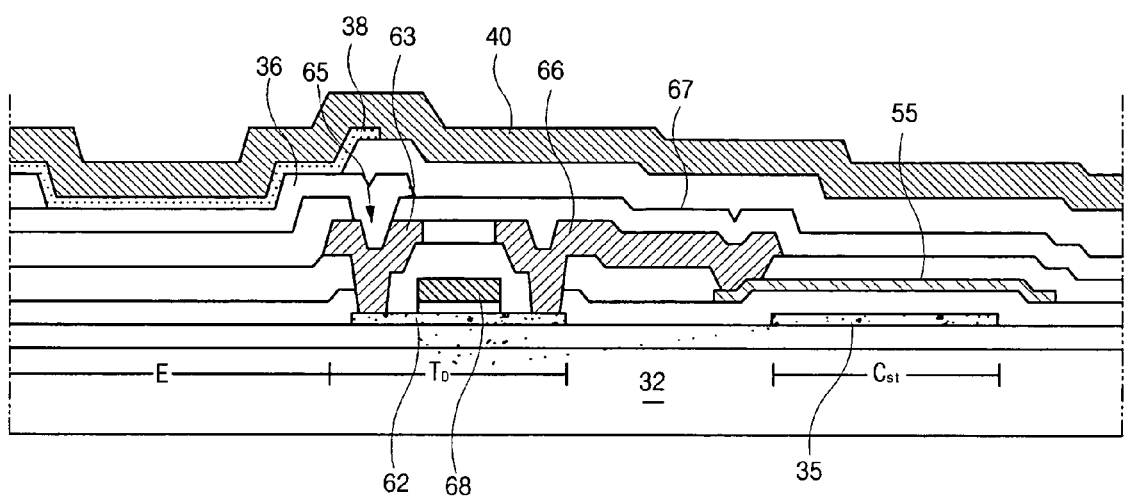
FIG. 4 is a cross-sectional view taken along the line IV-IV of FIG. 3.
Figure 5:
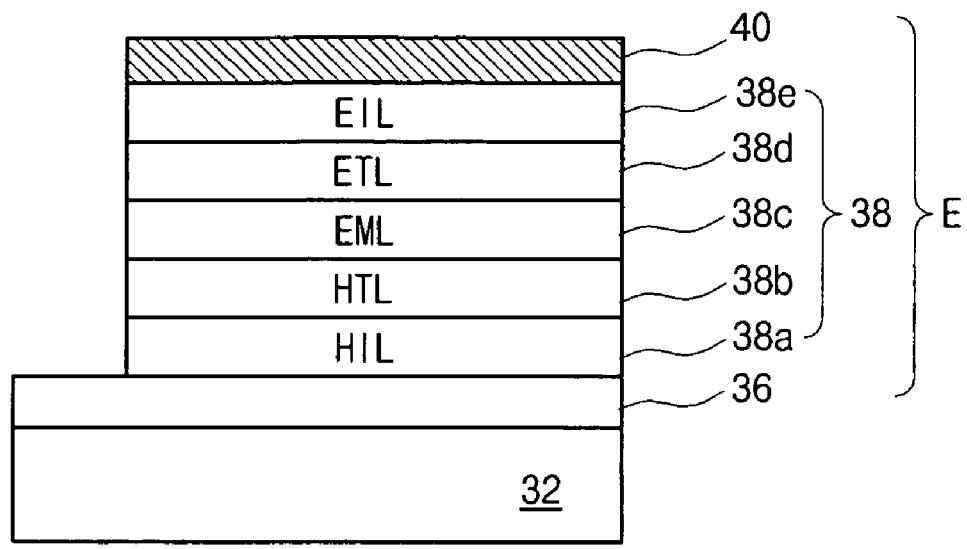
FIG. 5 is a schematic cross-sectional view of an organic electroluminescent diode according to the related art.
Figure 6:
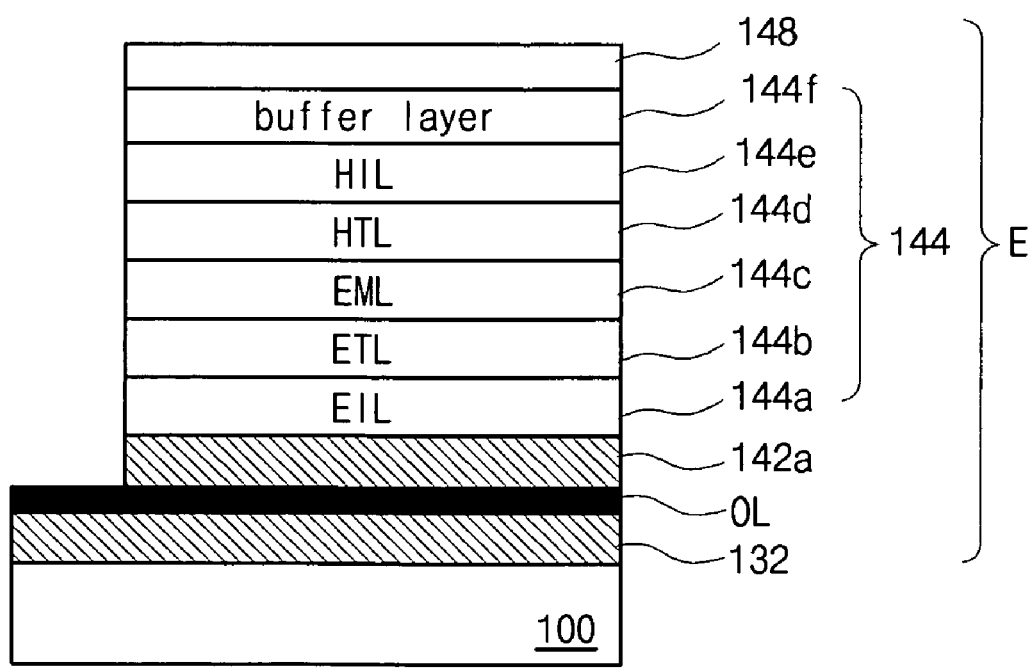
FIG. 6 is a cross-sectional view of an organic electroluminescent diode according to a first exemplary embodiment of the present invention.
Figure 7:
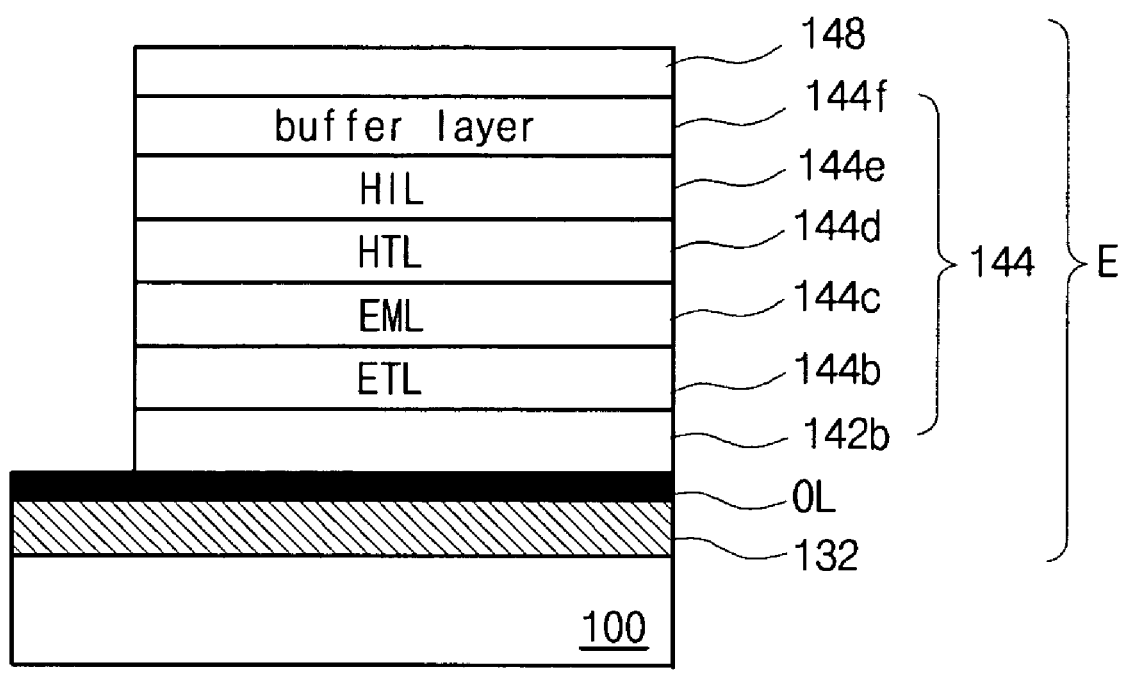
FIG. 7 is a cross-sectional view of an organic electroluminescent diode according to a second exemplary embodiment of the present invention.

FIG. 6 is a cross-sectional view of an organic electroluminescent diode according to a first exemplary embodiment of the present invention, and FIG. 7 is a cross-sectional view of an organic electroluminescent diode according to a second exemplary embodiment of the present invention.

As shown in FIG. 6, the organic electroluminescent diode E is formed on the substrate 100. The organic electroluminescent diode E includes a first electrode 132, a first injection layer 142a, an organic luminescent layer 144 and the second electrode 148. The first injection layer 142a is formed over the first electrode 132, and the organic luminescent layer 144 is formed between the first injection layer and the second electrode 148. The first electrode 132 and the second electrode 148 function as a cathode and an anode, respectively. Here, the second electrode 148 has a greater work function than the first electrode 132. The second electrode 148 may be formed of one of ITO and IZO. The first electrode 132 may be formed of one of Ca, Al, aluminum alloy (AlNd), Mg, Ag or Li. The organic luminescent layer 144 may have a six-layered structure. The organic luminescent layer 144 includes the EIL 144a, the ETL 144b, the EML 144c, the HTL 144d and the HIL 144e and a buffer layer 144f. Here, the EIL 144a is formed between the first injection layer 142a and the ETL 144b.

When the second electrode 148 is deposited by the sputtering method, the HIL 144e is damaged if the buffer layer 144f is omitted. In other words, the buffer layer 144f prevents the HIL 144e from being damaging during deposition of the second electrode 148. The second electrode 148 is formed of a transparent conductive material, such as ITO and indium-zinc-oxide (IZO). Since the buffer layer 144f has a property of the HIL 144e and impact resistant property against depositing of the transparent conductive material, the buffer layer 144f may be formed of one of copper phthalocyanine (CuPC) and vanadium pentoxide ($V_2O_5$). Moreover, since the CuPC is able to be formed in thin film and have a low threshold voltage and a high mobility, there is an advantage in that the OELD device includes the buffer layer 144f of the CuPC. The CuPC layer is also flexible.

When the HIL 144e is formed of one of CuPC and $V_2O_5$, the organic luminescent layer 144 may have a five-layered structure without the buffer layer 144f. Since the HIL 144e made of one of CuPC and $V_2O_5$, it is not damaged during deposition of the second electrode 148, and the HIL 144e functions as both the buffer layer and the HIL.

The first injection layer 142a resolves the short circuit problem between the first electrode 132 and the organic luminescent layer 144. During the fabricating process of the OELD device, an oxidation layer OL is formed on the first electrode 132. As mentioned above, when the first electrode 132 formed of Al is exposed to air, the first electrode 132 reacts with the air such that the oxidation layer OL is formed on the first electrode 132. The oxidation layer OL causes the short circuit problem between the first electrode 132 and the organic luminescent layer 144, and the organic electroluminescent diode E does not work.

The first injection layer 142a is formed between the first electrode 132 and the organic luminescent layer 144 to resolve the short circuit problem. The first injection layer 142a includes at least one of Al and alkali metals. The alkali metals have a higher reactivity than a material of the first electrode 132. Thus, the electron from the first electrode 132 is transported into the EIL 144a by the first injection layer 142a in spite of the oxidation layer OL.

As shown in FIG. 7, when the first injection layer 142a is formed of the alkali metals, the organic luminescent layer 144 may have a five-layered structure without the EIL 144a. In other words, a second injection layer 142b is formed over the first electrode 132, and the organic luminescent layer 144, which includes the ETL 144b, the EML 144c, the HTL 144d, the HIL 144e and the buffer layer 144f, is formed on the second injection layer 142b. The second electrode 148 is formed on the buffer layer 144f. The oxidation layer OL may be formed between the first electrode 132 and the second injection layer 142 during the fabricating process of the OELD device. However, the second injection layer 142b prevents the short circuit problem between the first electrode 132 and the organic luminescent layer 144.

As mentioned above, the second electrode 148 is formed of the transparent conductive material, such as ITO or IZO, and the first electrode 132 is formed of a metallic material, such as Ca, Al, Mg, Ag and Li. Since the second electrode 148 of the transparent conductive material is formed at an upper layer of the organic electroluminescent diode E, light emitted from the organic luminescent layer 144 emits upward. It may be referred to as the top emission type OELD device. The top emission type OELD device has an improved aperture ratio. Moreover, since the first electrode 132 is formed at a lowest layer of the organic electroluminescent diode E and connected to the driving element (not shown) on the substrate 100, the driving element can include an n-type amorphous silicon TFT. As a result, there are advantages in the fabricating process and production costs of the OELD device.

Figure 8:
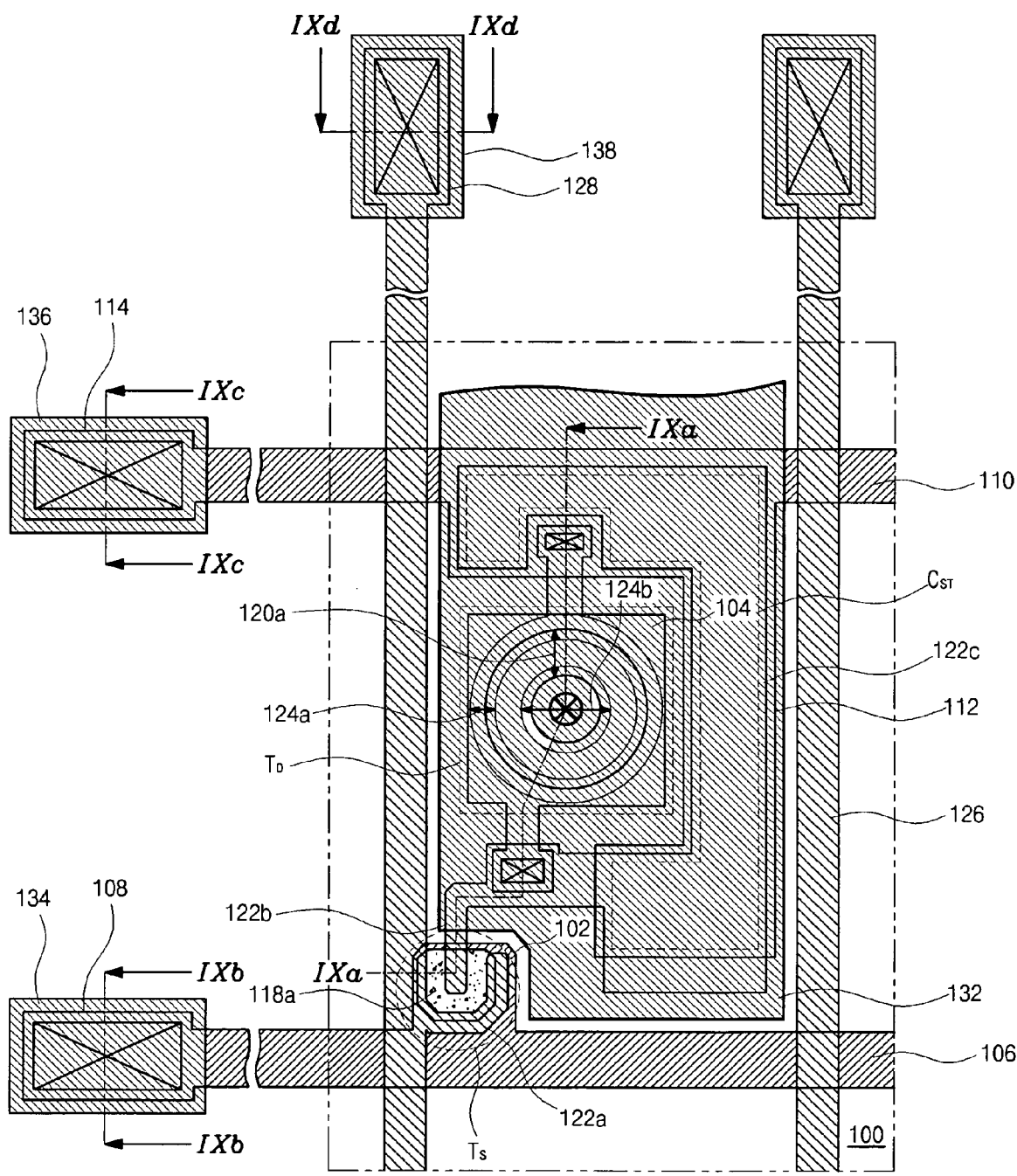
FIG. 8 is a schematic plane view showing an array substrate for an OELD device according to present invention.

FIG. 8 is a schematic plane view showing an array substrate for an OELD device according to present invention.

As shown in FIG. 8, in the array substrate for the OELD device, a gate line 106, a data line 126 and a power line 110 are formed on the substrate 100. The gate line 106 and the data line 126 cross each other to define a plurality of pixel region P on the substrate 100. The power line 110 is parallel to and separated from the gate line 106.

The switching element Ts and the driving element $T_D$, which are connected to each other, are formed on each pixel region P. The switching and driving elements Ts and $T_D$ include the n-type TFT. The n-type TFT of the switching element Ts includes a gate electrode 102, an active layer 118a, an ohmic contact layer (not shown) and source and drain electrodes 122a and 122b. Similarly, the n-type TFT of the driving element $T_D$ includes a gate electrode 104, an active layer 120a, an ohmic contact layer (not shown) and source and drain electrodes 124a and 124b. The drain electrode 122b of the switching element Ts is connected to the gate electrode 104 of the driving element $T_D$. The gate electrode 102 of the switching element Ts is connected to the gate line 106 such that a gate signal is supplied to the gate electrode 102 of the switching element Ts through the gate line 106. The source electrode 122a of the switching element Ts is connected to the data line 126 such that a data signal is supplied to the source electrode 122a of the switching element Ts through the data line 126.

A gate pad 108 is formed at an end of the gate line 106, and a gate pad electrode 134 contacts the gate pad 108. Similarly, a data pad 128 is formed at an end of the data line 126, and a data pad electrode 138 contacts the data pad 128. Moreover, a power pad 114 is formed at an end of the power line 110, and a power pad electrode 136 contacts the power pad 114.

A storage capacitor Cst includes a first storage electrode 112, a second storage electrode 122c and a dielectric layer (not shown) therebetween. The first storage electrode 112 extends from the power line 110, and the second storage electrode 122c extends from the drain electrode 122b of the switching element Ts.

The first electrode 132 of the organic electroluminescent diode E (of FIGS. 6 and 7) is formed on an entire surface of the pixel region P. The first electrode 132 is connected to the drain electrode 124b of the driving element $T_D$. Though not shown in FIG. 8, the organic luminescent layer 142 (of FIGS. 6 and 7) and the second electrode 148 (of FIGS. 6 and 7) are formed on the first electrode 132. The first electrode 132, the organic luminescent layer 142 (of FIGS. 6 and 7) and the second electrode 148 (of FIGS. 6 and 7) constitute the organic electroluminescent diode E (of FIGS. 6 and 7).

The switching element Ts and the driving element $T_D$ include the n-type TFT having the active layers 118a and 120a of amorphous silicon, respectively. The source electrodes 122a and 124a and the drain electrodes 122b and 124b may have a variety of shapes to improve a driving properties of the switching and driving elements Ts and $T_D$.

For example, as shown in FIG. 8, the source electrode 122a of the switching element Ts has a U-shape, and the drain electrode 122b of the switching element Ts has a bar shape. The drain electrode 122b is disposed in the U-shape to be separated from the U-shape. The source and drain electrodes 124a and 124b of the driving element $T_D$ have one of a ring shape and a disc shape. The source electrode 124a has a disc shape, and the drain electrode 124b is disposed in the source electrode 124a. When the source electrodes 122a and 124a and the drain electrodes 122b and 124b have the above-mentioned structures, channel regions, which are formed between the source electrode 122a and the drain electrode 122b and between the source electrode 124a and the drain electrode 124b, have a smaller length and a greater width than a channel region in the related art. As a result, the switching and driving elements Ts and $T_D$ are prevented from deteriorating by the above mentioned structure.

FIGS. 9A to 9D are cross-sectional views taken along the lines IXa-IXa, IXb-IXb, IXc-IXc and IXd-IXd of FIG. 8, respectively.

As shown in FIGS. 9A to 9D, a switching region S, a driving region D and a storage region C are defined in the pixel region P on the substrate 100. Moreover, a gate region GR, a power region PR and a data region DR are formed at periphery of the pixel region P. The switching and driving elements Ts and $T_D$ of the n-type TFT are formed in the switching and driving regions S and C, respectively. The storage capacitor Cst, which includes the first and second storage electrodes 112 and 122c and a gate insulating layer 116 therebetween, is formed in the storage region S. The first and second storage electrodes 112 and 122c extend from the power line 110 (of FIG. 8) and the drain electrode 122b of the switching element Ts, respectively, and the gate insulating layer 116 functions as the dielectric layer.

The first electrode 132 of an opaque material is formed over the driving element $T_D$ in each pixel regions P. The first electrode 132 contacts the drain electrode 124b of the driving element $T_D$ though a third contact hole CH3. An injection layer 142, which includes one of the first and second injection layers 142a (of FIG. 6) and 142b (of FIG. 7), is formed on the first electrode 132. Before the injection layer 142 is formed on the first electrode 132, the first electrode 132 is exposed to air. In this case, the first electrode 132 reacts with the air such that the oxidation layer OL is formed on the first electrode 132. The oxidation layer OL causes the short circuit between the first electrode 132 and the organic luminescent layer 144 (of FIGS. 7 and 8). Since the oxidation layer OL is an undesired layer, the oxidation layer OL should be removed, thereby increasing the fabrication process. However, the injection layer 142 of the OELD device according to the present invention prevents the short circuit problem resulting from the oxidation layer OL as mentioned above.

Then, the organic luminescent layer 144 and the second electrode 148 are sequentially formed on the first electrode 132. Unlike the first electrode 132, the second electrode 148 may be formed on an entire surface of the first electrode 100. The first and second electrodes 132 and 148 function as anode and cathode, respectively. The first and second electrodes 132 and 148 and the organic luminescent layer 144 constitute the organic electroluminescent diode E (of FIGS. 6 and 7). The organic luminescent layer 144 has multiple-layered structures as shown in FIGS. 6 and 7. A passivation layer 130 is formed between the first electrode 132 and the switching element Ts and between the first electrode 132 and the driving element $T_D$.

The switching element Ts in the switching region S includes the gate electrode 102, the gate insulating layer 116, the active layer 118a, and the source and drain electrodes 122a and 122b. Similarly, the driving element $T_D$ in the driving region D includes the gate electrode 104, the gate insulating layer 116, the active layer 120a and the source and drain electrodes 124a and 124b. The drain electrode 122b of the switching element Ts is connected to the gate electrode 104 through a first contact hole CH1. The drain electrode 124b is connected to the power line 110 (of FIG. 8) through a second contact hole and the first storage electrode 112.

After forming the first electrode 132, a bank 140 surrounding the pixel region P is formed such that the organic luminescent layers 144 between adjacent pixel regions P do not contact each other.

Figure 9A:
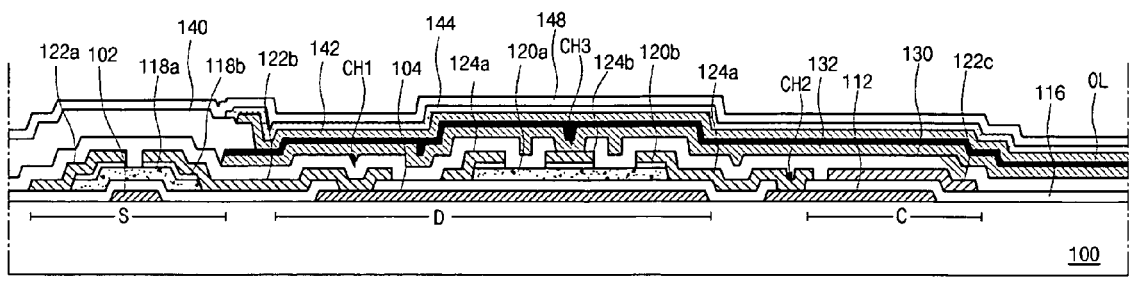
FIGS. 9A to 9D are cross-sectional views taken along lines IXa-IXa, IXb-IXb, IXc-IXc and IXd-IXd of FIG. 8, respectively.
Figure 9B:
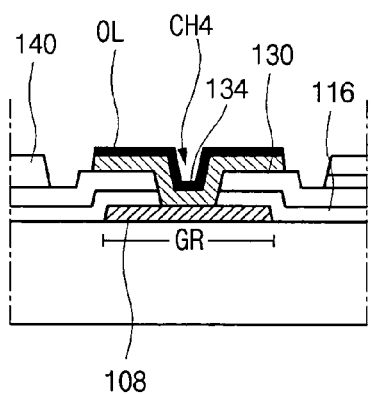

As shown in FIG. 9B, the gate pad 108 and the gate insulating layer 116, the passivation layer 130 and the gate pad electrode 134 are formed in the gate region GA. The gate pad 108 is formed at the end of the gate line 106 (of FIG. 8). The gate pad 108 is formed of a same layer and with a same material as the gate electrodes 102 and 104 (of FIG. 9A). The gate insulating layer 116 and the passivation layer 130 have a fourth contact hole CH4. The gate pad electrode 134 contacts the gate pad 108 through the fourth contact hole CH4.

Figure 9C:
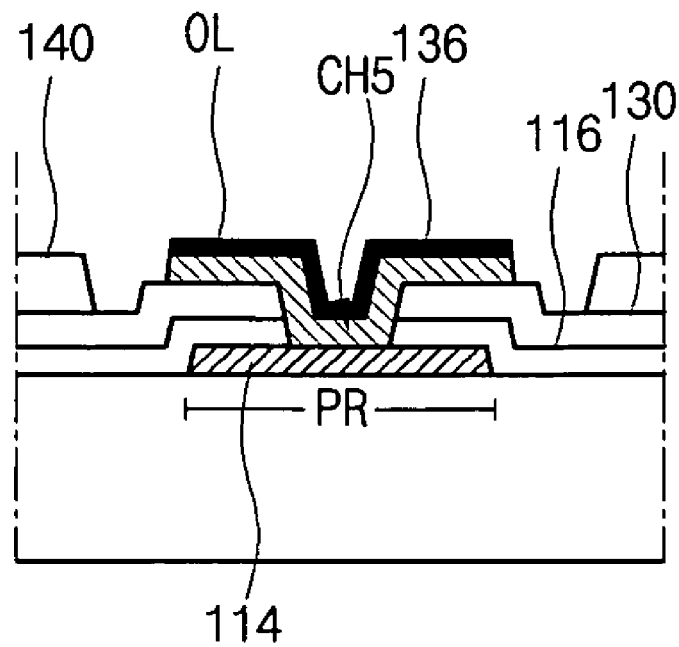

As shown in FIG. 9C, the power pad 114 and the gate insulating layer 116, the passivation layer 130 and the power pad electrode 136 are formed in the power region PA. The power pad 114 is formed at the end of the power line 110 (of FIG. 8). The power pad 114 is formed of a same layer and with a same material as the power line 110 (of FIG. 8). The gate insulating layer 116 and the passivation layer 130 have a fifth contact hole CH5. The power pad electrode 114 contacts the power pad 136 through the fifth contact hole CH5.

Figure 9D:
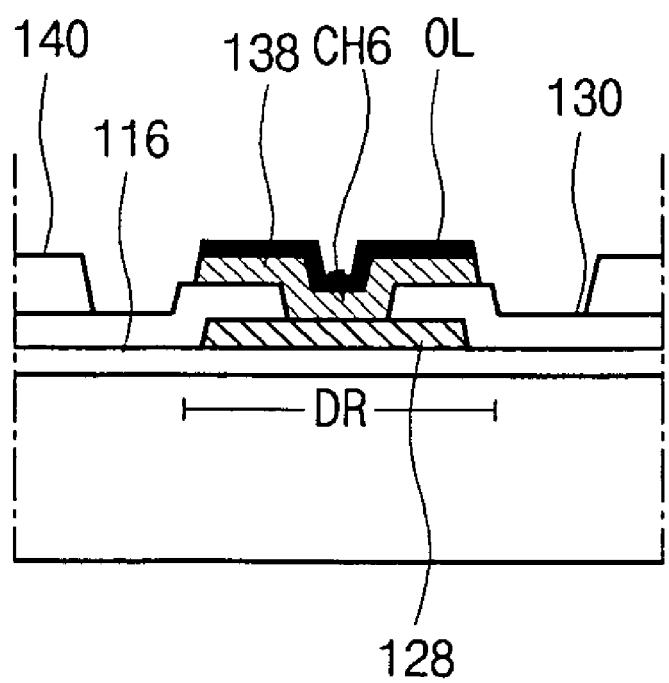
Figure 10A:
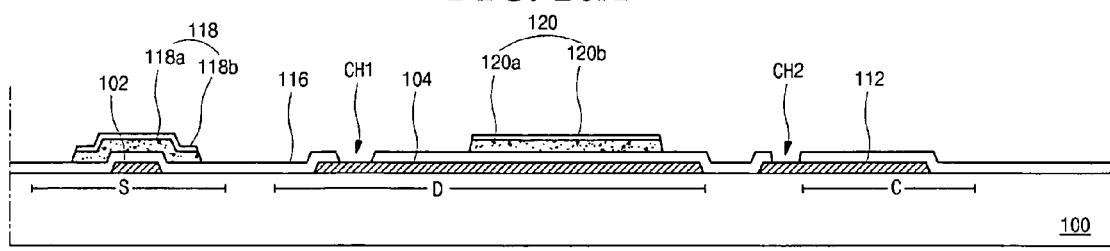
FIGS. 10A to 10E are cross-sectional views showing fabricating processes of the structure shown in FIG. 9A.
Figure 10B:
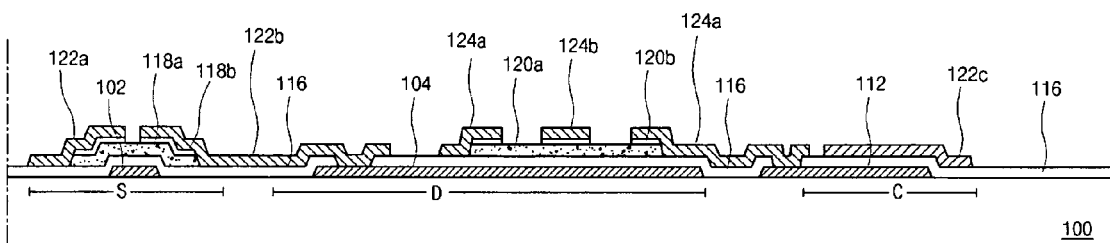
Figure 10C:
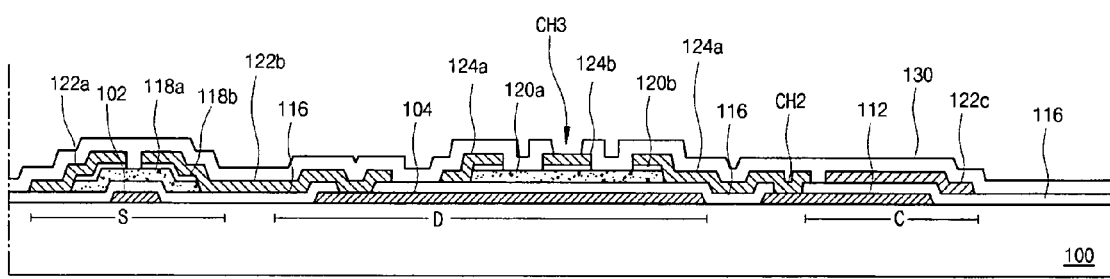
Figure 10D:
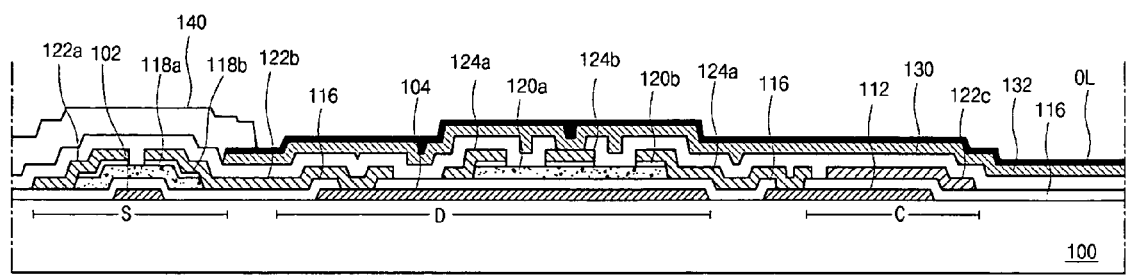
Figure 10E:
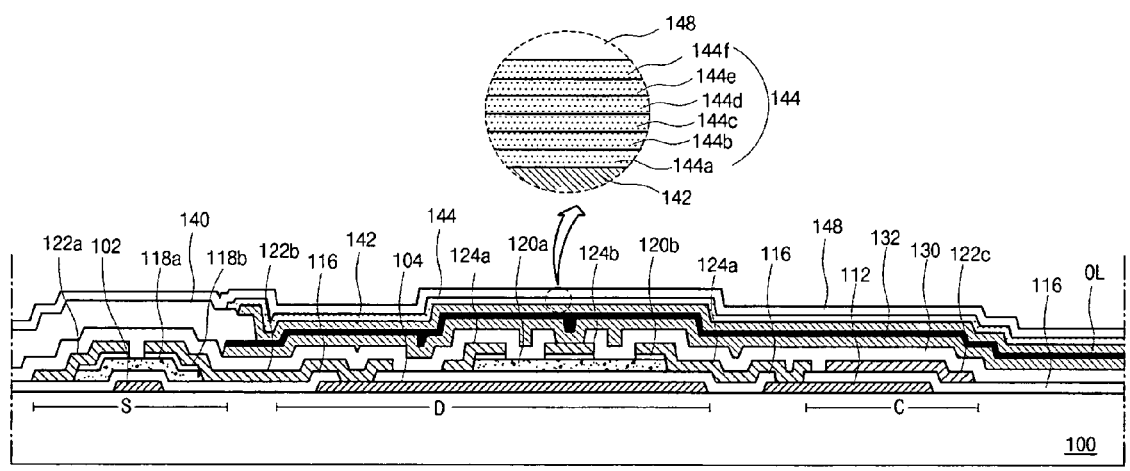
Figure 11A:
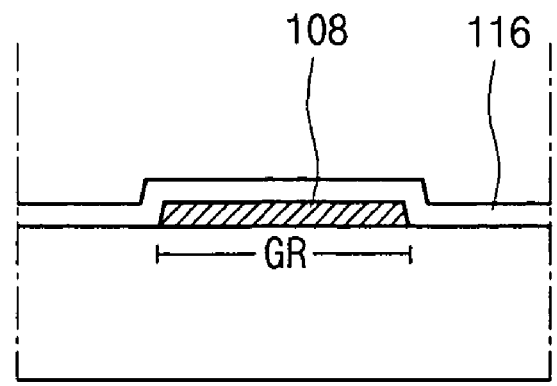
FIGS. 11A to 11E are cross-sectional views showing fabricating processes of the structure shown in FIG. 9B.
Figure 11B:
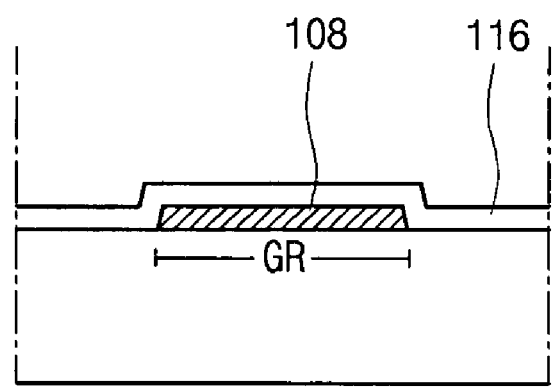
Figure 11C:
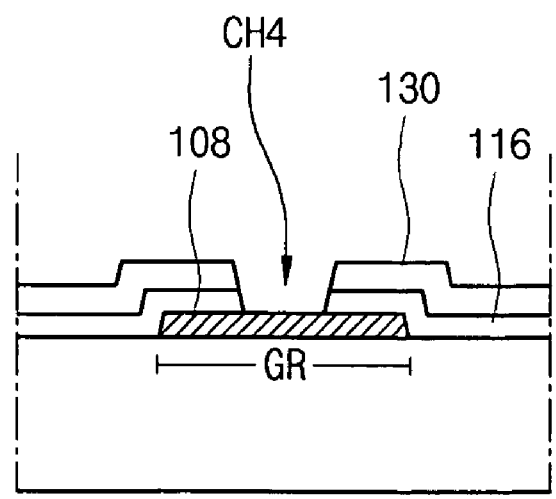
Figure 11D:
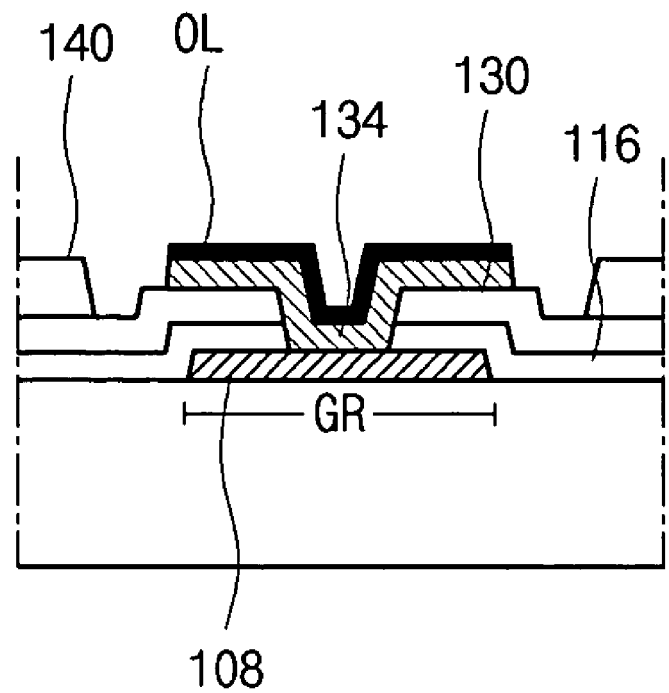
Figure 11E:
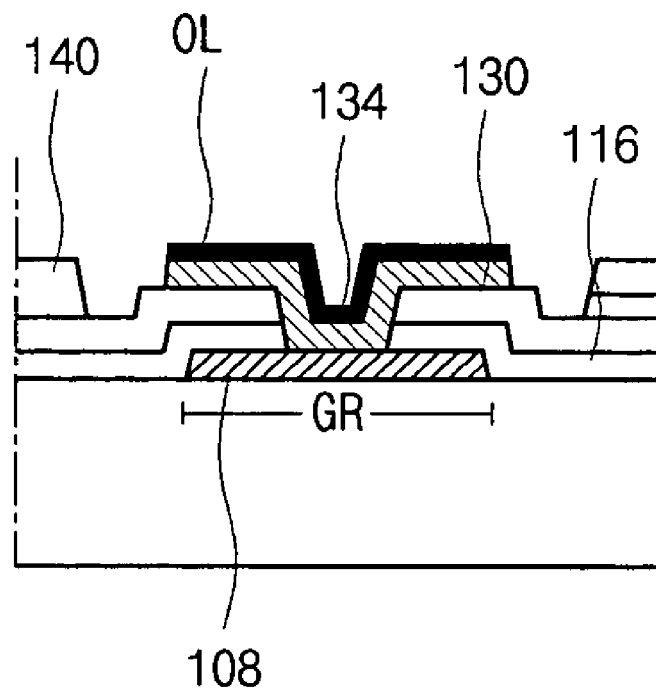
Figure 12A:
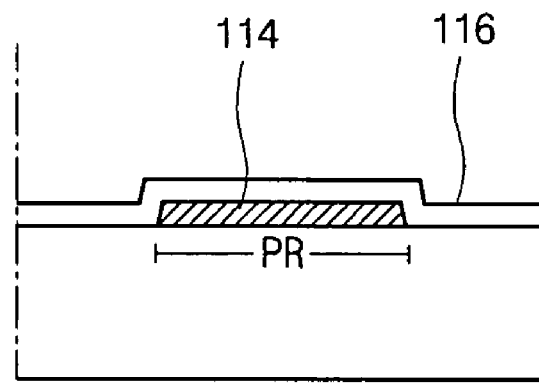
FIGS. 12A to 12E are cross-sectional views showing fabricating processes of the structure shown in FIG. 9C.
Figure 12B:
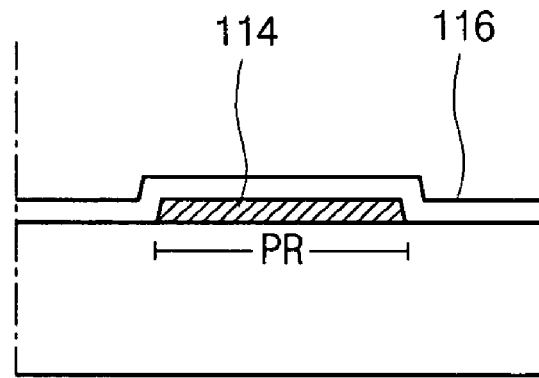
Figure 12C:
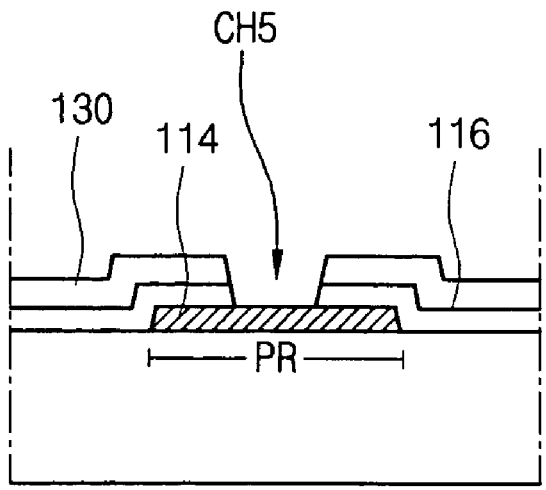
Figure 12D:
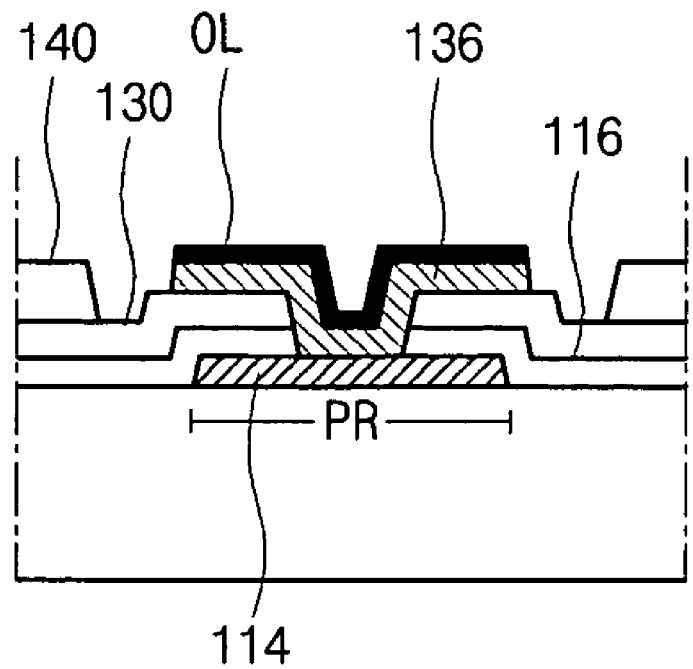
Figure 12E:
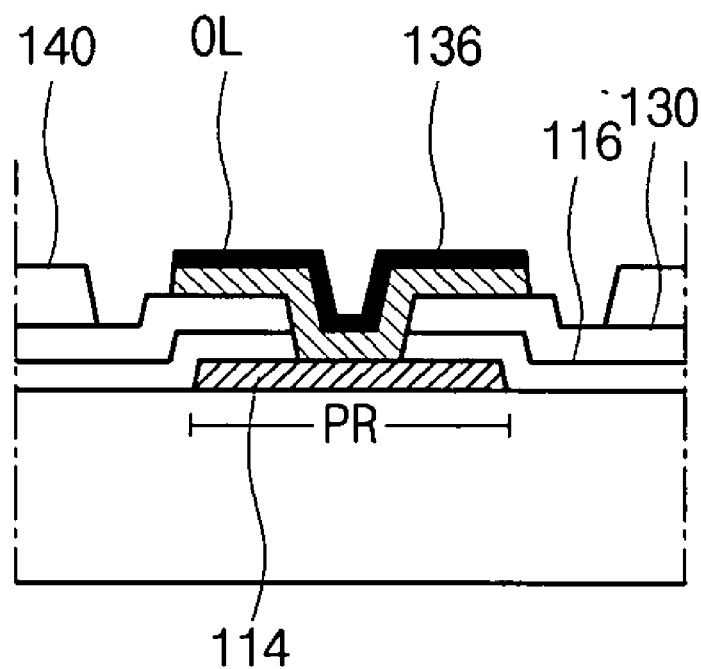
Figure 13A:
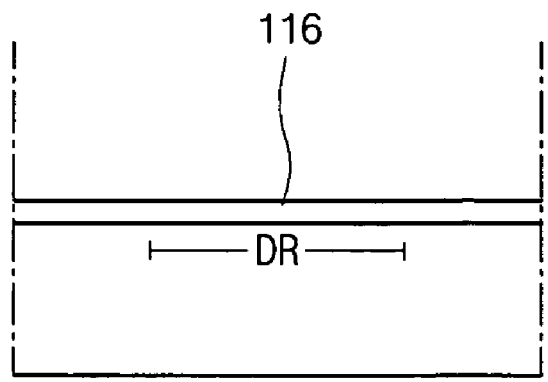
FIGS. 13A to 13E are cross-sectional views showing fabricating processes of a the structure shown in FIG. 9D.
Figure 13B:
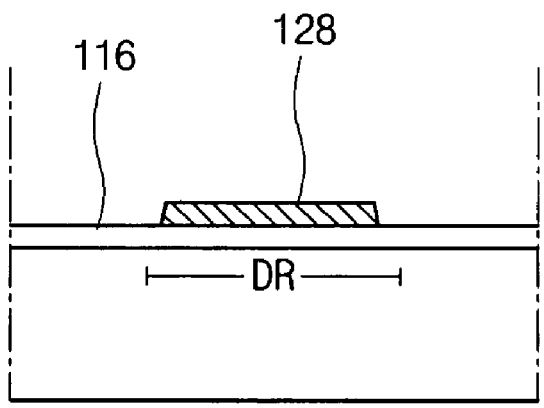
Figure 13C:
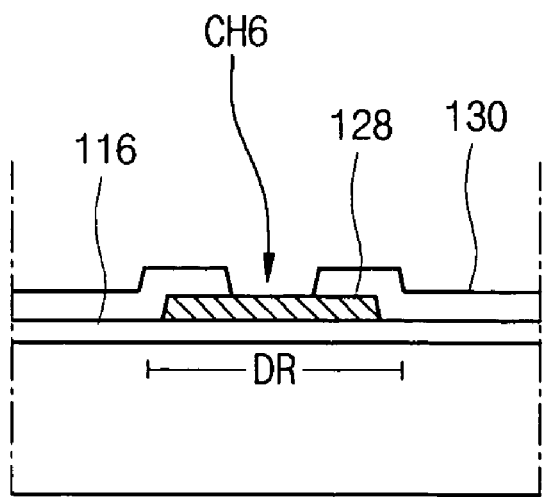
Figure 13D:
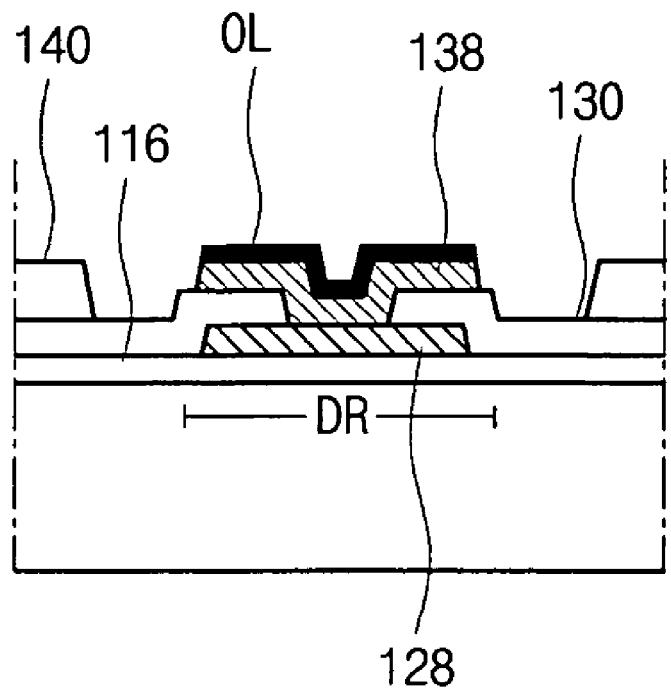
Figure 13E:
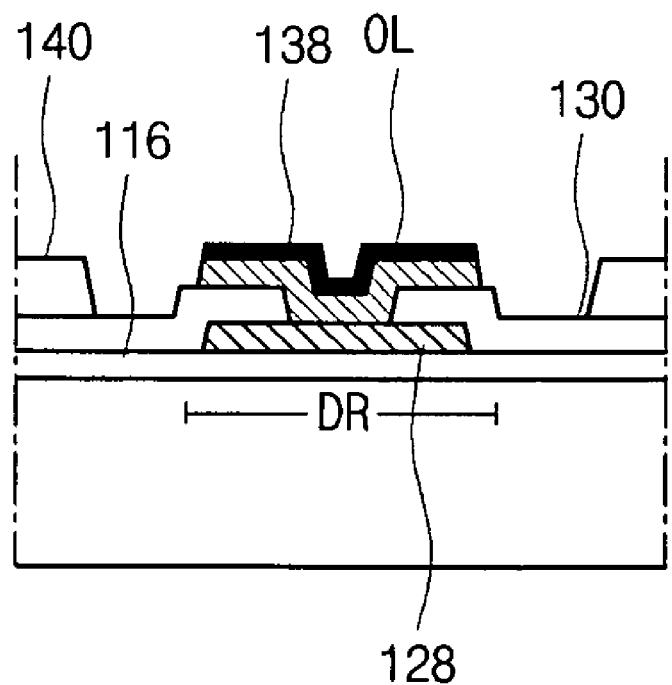

As shown in FIG. 9D, the data pad 128 and the gate insulating layer 116, the passivation layer 130 and the data pad electrode 138 are formed in the data region DA. The data pad 128 is formed at the end of the data line 126 (of FIG. 8). The data pad 128 is formed of a same layer and with a same material as the data line 126 (of FIG. 8). The gate insulating layer 116 and the passivation layer 130 have a sixth contact hole CH6. The data pad electrode 138 contacts the data pad 128 through the sixth contact hole CH6.

FIGS. 10A to 10E are cross-sectional views showing fabricating processes of a portion in FIG. 9A, and FIGS. 11A to 11E are cross-sectional views showing fabricating processes of a portion in FIG. 9B. FIGS. 12A to 12E are cross-sectional views showing fabricating processes of a portion in FIG. 9C, and FIGS. 13A to 13E are cross-sectional views showing fabricating processes of a portion in FIG. 9D.

As shown in FIGS. 10A, 11A, 12A and 13A, the switching, driving and storage regions S, D and C in the pixel region P, and the gate, power and data regions GR, PR and DR are defined on the substrate 100. The gate electrodes 102 and 104 in the switching and driving regions S and D, the first storage electrode 112 in the storage region S, the gate pad 108 in the gate region GR and the power pad 114 in the power region PR are formed on the substrate 100 by depositing and patterning a first conductive metallic material using a patterning mask (not shown). At the same time, the gate line 106 (of FIG. 8) and the power line 110 (of FIG. 8) are formed on the substrate 110. The gate pad 108 is located at the end of the gate line 106 (of FIG. 8), and the power pad 114 is located at the end of the power line 110 (of FIG. 8). The first storage electrode 112 extends from the power line 110 (of FIG. 8). The conductive metallic material includes at least one of Al, aluminum alloy (AlNd), chromium (Cr), Molybdenum (Mo), copper (Cu) and Titanium (Ti).

Then, the gate insulating layer 116 is formed on the substrate 110 by depositing a first inorganic insulating material. The first inorganic insulating material includes at least one of silicon oxide ($SiO_2$) and silicon nitride ($SiN_x$).

Next, the semiconductor layer 118 including the active layer 118a and the ohmic contact layer 118b in the switching region S, and the semiconductor layer 120 including the active layer 120a and the ohmic contact layer 120b in the driving region D are formed on the gate insulating layer 116 by depositing and patterning an intrinsic amorphous silicon material and an impurity-doped amorphous silicon material. The semiconductor layers 118 and 120 correspond to the gate electrodes 102 and 104, respectively.

Thereafter, the first and second contact holes CH1 and CH2 are formed through the gate insulating layer 116 by patterning the gate insulating layer 116. The first and second contact holes CH1 and CH2 expose the gate electrode 104 in the driving region D and the first storage electrode 112.

As shown in FIGS. 10B, 11B, 12B and 13B, the source electrodes 122a and 124a in the switching and driving regions S and D, the drain electrodes 122b and 124b in the switching and driving regions S and D, the data pad 128 in the data region D and the second storage electrode 122c in the storage region C are formed on the substrate 110 by depositing and patterning a second conductive material. At the same time, the data line 126 (of FIG. 8) is formed on the gate insulating layer 116. The second conductive material includes at least one of Al, aluminum alloy (AlNd), chromium (Cr), Molybdenum (Mo), copper (Cu) and Titanium (Ti). The source electrode 122a in the switching region S extends from the data line 126 (of FIG. 8). The source and drain electrodes 122a and 122b in the switching region S are separated from each other, and the source and drain electrodes 124a and 124b in the driving region D are separated from each other. The second storage electrode 122c extends from the drain electrode 122b in the switching region S. The drain electrode 122b in the switching region S contacts the gate electrode 104 in the driving region D through the first contact hole CH1 (of FIG. 10A). The drain electrode 124b in the driving region DR contacts the first storage electrode 112 through the second contact hole CH2 (of FIG. 10A).

Then, channel regions are defined by removing the ohmic contact layer 118b between the source and drain electrodes 122a and 122b in the switching region S, and the ohmic contact layer 120b between the source and drain electrodes 124a and 124b in the driving region D. The channel regions expose the active layers 118a and 120a. In this case, to decrease the length of the channel region or increase the width of the channel region, the source electrodes 122a and 124a may have one of a U-shape and a ring shape, and the drain electrodes 122b and 124b may have one of a bar shape and a disc shape. The drain electrodes 122b and 124b are disposed in and separated from the source electrodes 122a and 122b.

Next, as shown in FIGS. 10C, 11C, 12C and 13C, the passivation layer 130 is formed on the substrate 110 by depositing a second inorganic insulating material. The second inorganic insulating material includes at least one of silicon oxide ($SiO_2$) and silicon nitride ($SiN_x$). Next, the third to sixth contact holes CH3, CH4, CH5 and CH6 are formed through the passivation layer 130 by patterning the passivation layer 130. The third and fourth contact holes CH3 and CH4 expose the drain electrode 124b in the driving region D and the gate pad 108 in the gate region GR, respectively, and the fifth and sixth contact holes CH5 and CH5 expose the power pad 114 in the power region PR and the data pad 128 in the data region DR, respectively.

As shown in FIGS. 10D, 11D, 12D and 13D, the first electrode 132, the gate pad electrode 134, the power pad electrode 136 and the data pad electrode 138 are formed on the passivation layer 130 by depositing and patterning a metallic material, such as Al and AlNd. The first electrode 132 and the gate pad electrode 134 contact the drain electrode 124b in the driving region D and the gate pad 108 through the third and fourth contact holes CH3 and CH4, respectively. The power pad electrode 136 and the data pad electrode 138 contact the power pad 114 and the data pad 128 through the fifth and sixth contact holes CH5 and CH6, respectively.

After the first electrode 132 is formed, the first electrode 132 is exposed to air. The first electrode 132 reacts with the air such that the oxidation layer OL is formed on the first electrode 132. The oxidation layer OL has an insulating property and has a thickness of about dozens of angstroms. Of course, the oxidation layer OL is also formed on the gate pad electrode 134, the power pad electrode 136 and the data pad electrode 138.

Next, the bank 140 surrounding the pixel region P is formed on the substrate 100 by depositing and patterning a third inorganic insulating material. The third inorganic insulating material includes at least one of benzocyclobutene (BCB) and acrylate resin. Since the bank 140 surrounds the pixel region P, the first electrode 132 in the pixel region P, the gate pad electrode 134, the power pad electrode 136 and the data pad electrode 138 are exposed by the bank 140. The bank 140 prevents the organic luminescent layer 144 (of FIG. 9A) in adjacent pixel regions P from contacting each other.

As shown in FIGS. 10E, 11E, 12E and 13E, the injection layer 142 is formed on the first electrode 132 by depositing and patterning an injection metallic material. The injection metallic material includes at least one of Al and the alkali metals. As mentioned above, the alkali metals including Ca has a higher reactivity than the first electrode.

Then, the organic luminescent layer 144 is formed on the injection layer 142. The organic luminescent layer 144 has the EIL 144a, the ETL 144b, the EML 144c, the HTL 144d, the HIL 144e and the buffer layer 144f. That is, as shown in FIG. 7, when the injection layer 142 is formed of the alkali metals, the organic luminescent layer 144 may have a five-layered structure without the EIL 144a. Moreover, when the buffer layer 144f is formed of one of CuPC and $V_2O_5$, the organic luminescent layer 144 may have one of four and five-layered structures without the buffer layer 144f.

Next, the second electrode 148 is formed on the organic luminescent layer 142 by depositing and patterning the transparent conductive material. The transparent conductive material includes one of ITO and IZO. The first and second electrodes 132 and 148, the injection layer and the organic luminescent layer 142 constitute the organic electroluminescent diode E.

The lower substrate having the array element and the organic electroluminescent diode is fabricated by the above-mentioned processes. The top emission type OELD device according to the present invention is completed by attaching the lower substrate and the upper substrate including the moisture absorbent using the seal pattern.

It will be apparent to those skilled in the art that various modifications and variations can be made in the organic electroluminescent display device and method of fabricating the same of the present invention without departing from the spirit or scope of the invention. Thus, it is intended that the present invention covers the modifications and variations of this invention provided they come within the scope of the appended claims and their equivalents.

What is claimed is:

1. An organic electroluminescent display (OELD) device, comprising:
    a first substrate;
    a plurality of gate lines and a plurality of data lines crossing each other to define a plurality of pixel regions;
    a power line parallel to and separated from the gate lines;
    switching and driving elements connected to each other in each of the plurality of pixel regions on the first substrate, wherein each of the switching and driving elements include a gate electrode on the substrate, a gate insulating layer on the gate electrode, a semiconductor layer on the gate insulating layer and source and drain electrodes separated from each other on the semiconductor layer, wherein the semiconductor layer includes an active layer, which is formed of intrinsic amorphous silicon and disposed on the gate insulating layer, and an ohmic contact layer which is formed of impurity-doped amorphous silicon and disposed on the active layer;
    a storage capacitor including first and second storage electrodes and a dielectric layer between the first and second storage electrodes, wherein the first and second storage electrodes extend from the power line and the switching element, respectively, and the dielectric layer includes a single layer of the gate insulating layer such that the first storage electrode contacts a bottom surface of the gate insulating layer and the second storage electrode contacts a top surface of the gate insulating layer;
    a first electrode on the first substrate and connected to one of the driving element;
    an oxidation layer on the first electrode;
    an injection layer on the oxidation layer and including a metallic material having a higher reactivity than a material of the first electrode;
    an organic luminescent layer on the injection layer;
    a second electrode of a transparent conductive material on the organic luminescent layer; and
    a second substrate attached to and facing the first substrate.

2. The device according to claim 1, wherein the injection layer includes one of Al and an alkali metal.

3. The device according to claim 2, wherein the organic luminescent layer includes an electron transporting layer on the injection layer, an emitting material layer on the electron transporting layer, a hole transporting layer on the emitting material layer, a hole injection layer on the hole transporting layer.

4. The device according to claim 1, further comprising a buffer layer between the organic luminescent layer and the second electrode.

5. The device according to claim 4, wherein the organic luminescent layer includes an electron injection layer on the injection layer, an electron transporting layer on the electron injection layer, an emitting material layer on the electron transporting layer, a hole transporting layer on the emitting material layer, a hole injection layer on the hole transporting layer.

6. The device according to claim 5, wherein the buffer layer prevents the hole injection layer being damaged by formation of the second electrode and facilitates injection of holes from the second electrode into the hole injection layer.

7. The device according to claim 4, wherein the buffer layer includes one of CuPC and $V_2O_5$.

8. The device according to claim 7, wherein the organic luminescent layer includes an electron injection layer on the injection layer, an electron transporting layer on the electron injection layer, an emitting material layer on the electron transporting layer, and a hole transporting layer on the emitting material layer.

9. The device according to claim 8, wherein the buffer layer prevents the hole transporting layer being damaged by formation of the second electrode and facilitates injection of holes from the second electrode into the hole transporting layer.

10. The device according to claim 1, wherein the drain electrode of the switching element is connected to the gate electrode of the driving element, and the first electrode is connected to the drain electrode of the driving element.

11. The device according to claim 10, further comprising:
    a gate pad at an end of the gate line;
    a data pad at an end of the data line; and
    a power pad at an end of the power line.

12. The device according to claim 11, wherein the gate line, the gate pad, the power line and the power pad are formed of a same layer and with a same material.

13. The device according to claim 1, wherein the source electrode of at least one of the switching and driving elements includes one of a U-shape and a ring shape, and the drain electrode of at least one of the switching and driving elements includes one of a bar shape and a disc shape.

14. The device according to claim 1, wherein the transparent conductive material includes one of ITO and IZO.

15. The device according to claim 1, wherein the first electrode includes a conductive material having a lower work function than the second electrode.

16. The device according to claim 15, wherein the conductive material includes one of Al and AlNd.

17. The device according to claim 1, wherein the first electrode is formed in each of the plurality of pixel regions, and the second electrode is formed on an entire surface of the first substrate.

18. The device according to claim 1, wherein the first electrode and the organic luminescent layer are electrically connected to each other by the injection layer without a short circuit.

19. A method of fabricating an OELD device, comprising:
forming a gate line, a power line parallel to and spaced apart from the gate line, a switching gate electrode extending from the gate line, and a first storage electrode extending from the power line;
forming a gate insulating layer on the gate line, the power line, the switching gate electrode, a driving gate electrode and the first storage electrode;
forming a switching active layer on the gate insulating layer and corresponding to the switching gate electrode, a driving active layer on the gate insulating layer and corresponding to the driving gate electrode, wherein each of the switching active layer and the driving active layer is formed of intrinsic amorphous silicon;
forming a switching ohmic contact layer on the switching active layer and a driving ohmic contact layer on the driving active layer, wherein each of the switching ohmic contact layer and the driving ohmic contact is formed of impurity-doped amorphous silicon;
forming a data line on the gate insulating layer and crossing the gate line, a switching source electrode on the switching ohmic contact layer and extending from the data line, a switching drain electrode on the switching ohmic contact layer and spaced apart from the switching source electrode, a driving source electrode on the driving ohmic contact layer, a driving drain electrode on the driving ohmic contact layer and spaced apart from the driving source electrode, and a second storage electrode on the gate insulating layer and extending from the switching source electrode, wherein the second storage electrode overlapping the first storage electrode;
forming a first electrode on and connected to the driving drain electrode, wherein the first electrode exposed such that an oxidation layer is formed on the first electrode;
forming an injection layer on the oxidation layer and including a metallic material having a higher reactivity than a material of the first electrode;
forming an organic luminescent layer on the injection layer;
forming a second electrode of a transparent conductive material on the organic luminescent layer; and
attaching a second substrate to the first substrate.

20. The method according to claim 19, wherein the step of forming the organic luminescent layer includes forming a buffer layer as an uppermost layer of the organic luminescent layer.

21. The method according to claim 19, wherein the step of forming the organic luminescent layer includes:
forming an electron transporting layer on the injection layer;
forming an emitting material layer on the electron transporting layer; and
forming a hole transporting layer on the emitting material layer.

22. The method according to claim 21, wherein the step of forming the organic luminescent layer further includes forming an electron injection layer on the injection layer and a buffer layer on the hole transporting layer.

* * * * *